United States Patent
Choi et al.

(10) Patent No.: US 12,068,051 B2
(45) Date of Patent: Aug. 20, 2024

(54) BUILT-IN HIGH-FREQUENCY TEST CIRCUITRY WITHOUT DUTY DISTORTION

(71) Applicant: SanDisk Technologies LLC, Addison, TX (US)

(72) Inventors: Hoon Choi, Santa Clara, CA (US); Anil Pai, San Jose, CA (US); Venkatesh Prasad Ramachandra, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 187 days.

(21) Appl. No.: 17/749,813

(22) Filed: May 20, 2022

(65) Prior Publication Data

US 2023/0377677 A1    Nov. 23, 2023

(51) Int. Cl.
*G11C 29/54* (2006.01)
*G06F 1/08* (2006.01)
*G11C 16/04* (2006.01)

(52) U.S. Cl.
CPC ............. *G11C 29/54* (2013.01); *G06F 1/08* (2013.01); *G11C 16/0483* (2013.01)

(58) Field of Classification Search
CPC ....... G11C 29/54; G11C 16/0483; G11C 7/02; G11C 16/32; G11C 16/26; G11C 29/023; G11C 29/12015; G11C 29/50012; G11C 29/56012; G06F 1/08

See application file for complete search history.

(56) References Cited

U.S. PATENT DOCUMENTS

| 3,487,560 | A | * | 1/1970 | Gates | G06K 17/0032 434/355 |
| 6,141,271 | A | * | 10/2000 | Yoon | G11C 29/14 365/201 |
| 6,920,526 | B1 | * | 7/2005 | Sikkink | G06F 13/1673 710/52 |
| 8,477,543 | B2 | * | 7/2013 | Kwon | G11C 7/1078 365/198 |
| 11,482,262 | B1 | * | 10/2022 | Lee | G11C 7/1048 |
| 2002/0087768 | A1 | * | 7/2002 | Srikanth | G11C 7/1093 710/118 |
| 2003/0086303 | A1 | * | 5/2003 | Jeong | G11C 7/1087 365/194 |

(Continued)

*Primary Examiner* — Khamdan N. Alrobaie
(74) *Attorney, Agent, or Firm* — Sheppard, Mullin Richter & Hampton LLP

(57) ABSTRACT

Techniques for mitigating/eliminating the impact of duty distortion caused by delays in clock paths within a built-in high-frequency test circuit for NAND flash are disclosed. By mitigating or eliminating the impact of duty distortion, accuracy of the valid data window measurement is ensured. Rising edges of a strobe clock signal and an inverted strobe clock signal are used to respectively locate even and odd data (or vice versa) within an input buffer of the NAND flash during respective sweeps of the strobe and inverted strobe clock signals. In this manner, even if the strobe clock signal's duty ratio is distorted, there is no impact on the valid data window measurement. Further, read latency is used to introduce delay to a read enable (RE) clock signal, thereby obviating the need for a replica controlled delay in the RE clock path and eliminating the duty distortion that would otherwise occur.

12 Claims, 18 Drawing Sheets

(56) References Cited

U.S. PATENT DOCUMENTS

| | | | |
|---|---|---|---|
| 2003/0233604 A1* | 12/2003 | Lin | G11C 29/56 |
| | | | 714/718 |
| 2006/0163572 A1* | 7/2006 | Jeong | G11C 29/14 |
| | | | 257/48 |
| 2007/0230266 A1* | 10/2007 | Kao | G11C 7/1051 |
| | | | 365/189.16 |
| 2023/0386584 A1* | 11/2023 | Ramachandra | G11C 16/10 |

* cited by examiner

BUILT-IN HIGH-FREQUENCY TEST CIRCUITRY WITHOUT DUTY DISTORTION

BACKGROUND

Flash memory is an electronic, non-volatile computer memory storage medium that can be electrically erased and reprogrammed. Flash memory is now widely used across a range of products and industries including computers, smartphones, tablets, digital audio players, digital cameras, wearable devices, video games, scientific instrumentation, industrial robotics, medical electronics, and so forth. NAND flash memory—one of the two primary types of flash memory—has become the preferred choice of flash memory for memory cards, USB flash drives, solid-state drives, and the like. NAND flash may employ floating gate transistors (e.g., floating gate metal-oxide-semiconductor field-effect transistors (MOSFETs)) or charge trapping layer (CTL) transistors, connected in a manner that resembles a NAND logic gate. Various types of NAND flash technology exist and differ with respect to the number of programmable states they support, and thus, the number of bits of information that an individual memory cell can store.

Various forms of testing may be conducted on NAND flash to ensure that it meets minimum performance requirements. The extent and nature of the testing performed can be complex in light of the unique test capabilities that NAND flash requires. Advances in flash technology have raised reliability and quality challenges for manufacturers, renewing the need for improved test coverage.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
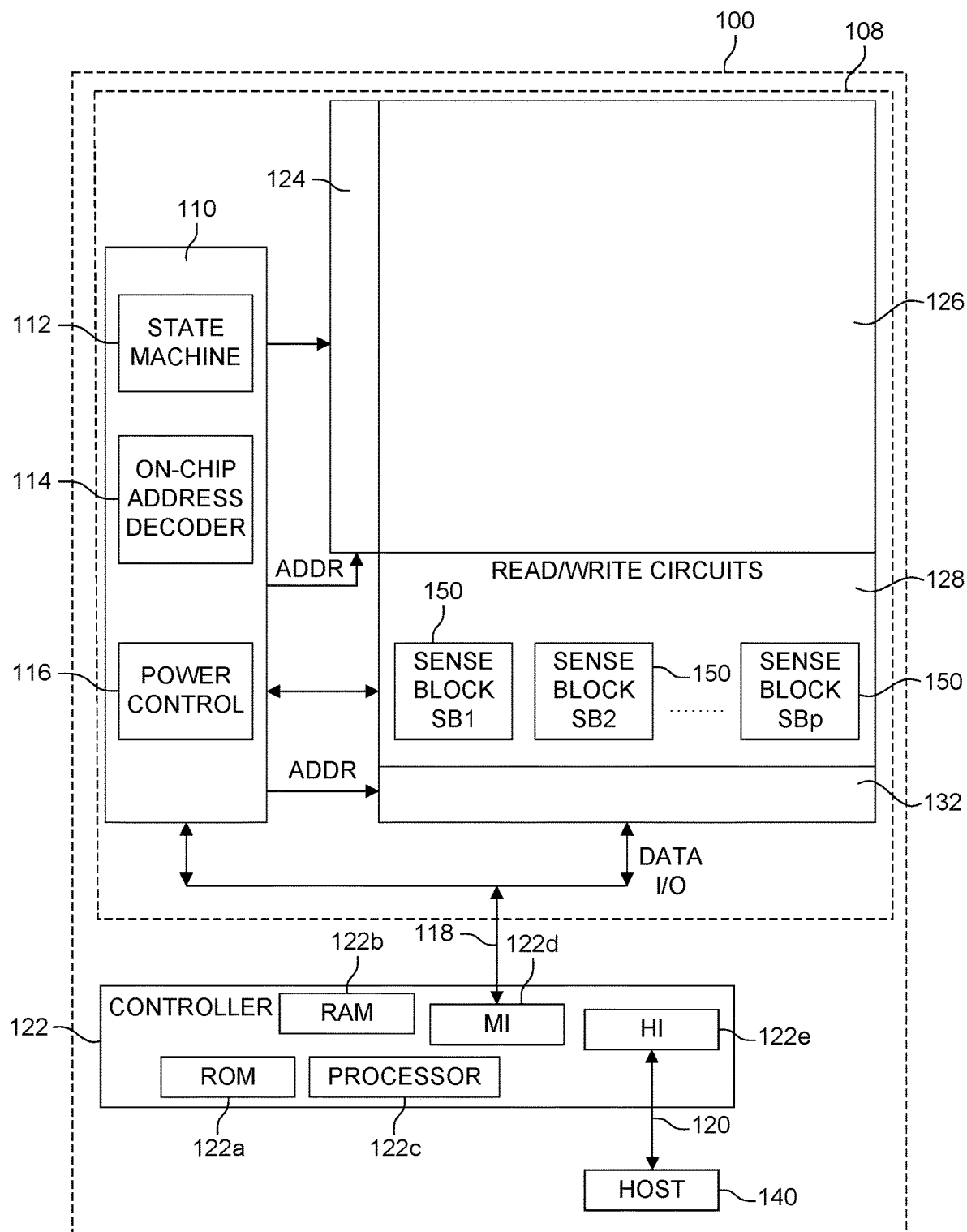
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

Testing of NAND flash memory such as high-speed testing is generally done at the package level due to the unavailability of a high-speed tester at the wafer level. A NAND flash package includes multiple dies. If testing is performed at the package level, even a single faulty die in a package can render the entire package unusable. While attempts may be made to salvage any functioning dies in the package, the economic cost of not being able to use an assembled NAND flash package due to individual die failure is significant.

A built-in high-frequency test circuit, according to which data that is read out from NAND flash memory is provided to the input buffers of the NAND to serve as test data, enables high-speed testing at the wafer level. In operation, the built-in high-frequency test circuit may read data out from the NAND and place the data in output buffers. The data may then be written from the output buffers to input buffers of the NAND. Various testing such as measuring the valid data window may then be performed on the data in the input buffers. Utilizing data read from the NAND itself as test data obviates the need for external test data.

As part of operation of the built-in high-frequency test, a clock generator (which may be provided within the NAND itself) may generate a strobe clock signal (e.g., a DQS signal) and a read enable (RE) clock signal, for example. The DQS clock signal may drive a DQS output buffer and the RE clock signal may drive a DQ output buffer. The DQS clock and the RE clock may be used to read data from internal latches in the NAND and to place the read data in respective output buffers. More specifically, data read using the DQS clock may be placed in the DQS output buffer and the DOUT data read using the RE clock may be placed in the DQ output buffer. This capability to internally generate, within the NAND itself, the clock signals used to read data from the NAND—where the read data ultimately becomes input data to the NAND for testing purposes—obviates the need for an externally-provided clock.

The data read based on the DQS clock signal may be transferred from the DQS output buffer to a DQS input buffer of the NAND, and ultimately to internal DIN latches of the NAND. Similarly, the read DOUT data may be transferred from the DQ output buffer to a DIN input buffer of the NAND (also referred to herein interchangeably as a DQ input buffer), and ultimately to the internal DIN latches. In this manner, data read out from the NAND itself can serve as input test data to the NAND, enabling high-speed NAND testing to be performed at the wafer level without the need for externally-provided clock signals or externally-provided test data.

Because the same data in the output buffers of the NAND is fed to the input buffers of the NAND to serve as the test data, and because the DQS clock signal has a different alignment with respect to the valid data window for DIN operations than it does for DOUT operations, there is a potential for misalignment between the respective clocks received on the DQS and DIN paths, which in turn, can lead to loss of data read from the NAND. More specifically, for DIN operations, the DQS clock signal is center-aligned with the valid data window—that is, a rising or falling edge of the DQS clock signal falls within a center of the valid data window. For DOUT operations, however, the DQS clock signal is edge-aligned with the valid data window—that is, a rising or falling edge of the DQS clock signal is aligned with an edge of the valid data window. As a result of this difference in alignment of the DQS clock signal between DOUT and DIN operations, it is possible that some of the data read from the NAND is lost when it ultimately reaches the DIN latches. In particular, because the DQS clock signal is edge-aligned with respect to the valid data window, data on the DQS input buffer path may arrive substantially simultaneously with data on the DIN input buffer path. However, data arriving on the DIN input buffer path needs a certain amount of set-up time in order to ensure that the data is able to latch. By virtue of the data arriving essentially simultaneously on the DQS and DIN input buffer paths, which in turn, is due to the DQS clock signal being edge-aligned with respect to the valid data window, the set-up time that would normally be available on the DIN input buffer path is not present. This can result in at least a portion of the incoming data not successfully latching.

An objective of high-frequency testing at the wafer level may be to measure the valid data window to ensure that it meets NAND performance requirements. Measuring the valid data window may include performing a sweep of the DQS clock signal to locate the valid data window. If, however, data coming in on the DIN input buffer is not able to successfully latch due to insufficient set-up time, for example, the measurement of the valid data window may be inaccurate. To address the above-described concern, a controlled delay can be introduced to the DQS clock path in the read domain. Introducing the controlled delay to the DQS clock path can shift the DQS clock signal from being edge-aligned with the valid data window (as it is for DOUT operations) to being center-aligned with the valid data window (as it is for DIN operations). A sweep of the delayed DQS clock signal can then be performed to locate the valid data window.

Introducing the controlled delay, however, can produce duty distortion which can result in an inaccurate measurement of the valid data window. Ideally, to help ensure accuracy of the valid data window measurement, the DQS clock signal is generated to have a 50/50 duty ratio—that is, the DQS clock signal is at a high logic level 50% of the time and at a low logic level 50% of the time. Introducing the controlled delay as described above, however, can cause duty distortion, resulting in a deviation from the 50/50 duty ratio. This, in turn, can render the valid data window measurement inaccurate. Moreover, in order to match the DIN path with the delayed DQS path, a replica controlled delay can be added to the RE clock signal in the read domain. Similar to the duty distortion to the DQS clock signal caused by the controlled delay added to the DQS path, the replica controlled delay can cause duty distortion in the RE clock signal that drives the DQ output buffer path/DIN input buffer path, which as noted, can make the valid data window measurement inaccurate. Thus, if testing reveals a valid data window measurement that does not meet NAND flash performance requirements, it can be difficult to determine whether the valid data window truly does not meet the performance requirements or whether the measurement of the valid data window has been rendered inaccurate by duty distortion caused by the above-described clock signal delays.

Embodiments of the disclosed technology relate to systems, devices, circuits, methods, and techniques for mitigating or eliminating the impact of duty distortion caused by delays introduced to a built-in high-frequency test circuit for NAND flash, thereby ensuring accuracy of the valid data window measurement. As such, embodiments of the disclosed technology solve the above-described technical problem associated with built-in high-frequency NAND flash test circuitry—that is, the problem of clock signal delays introduced into the test circuitry causing duty distortion that leads to inaccurate valid data window measurements. At least in some instances, an inaccurate valid data window measurement can make it impossible to determine whether the NAND flash actually fails to meet performance requirements or whether an inaccurate valid data window measurement is giving the appearance that the NAND flash fails to meet the performance requirements. Embodiments of the disclosed technology eliminate this potential ambiguity by mitigating/eliminating duty distortion caused by controlled delays in a built-in high-frequency NAND flash testing circuit, and thereby ensuring the accuracy of the valid data window measurement.

In an example embodiment, to address the technical problem of duty distortion caused by a controlled delay introduced to a DQS clock path, instead of using both the rising and the falling edges of the DQS clock signal to locate the valid data window, the rising edge of the DQS clock signal is used to locate the even data and the rising edge of an inverted DQS clock signal is used to locate the odd data. In some embodiments, while the sweep of the DQS clock signal is performed, and the rising edge of the DQS clock signal is used to locate the even data, the rising edge data of the inverted DQS clock signal is ignored. Similarly, while the sweep of the inverted DQS clock signal is performed, and the rising edge of the inverted DQS clock signal is used to locate the odd data, the rising edge data of the DQS clock signal may be ignored. Using this technique, the valid data window can still be captured/measured as the window between when the even data is located using the rising edge of the DQS clock signal and when the odd data is located using the rising edge of the inverted DQS clock signal, but without running the risk of an inaccurate measurement of the valid data window that may otherwise result from duty distortion caused by a controlled delay on the DQS clock signal. More specifically, because duty distortion of the DQS clock signal can alter the duty ratio, utilizing both the rising and the falling edges of the DQS clock signal to locate the valid data window—as conventional techniques do—can lead to an inaccurate measurement of the valid data window. Embodiments of the disclosed technology utilize only the rising edges of the DQS clock signal and the inverted DQS clock signal to locate/measure the valid data window, and as such, can ensure accuracy of the measurement even in cases where delay on the DQS clock signal path causes serious duty distortion.

In an example embodiment, to address the technical problem of duty distortion caused by a replica controlled delay that is introduced to the RE clock signal path in built-in high-frequency test circuitry, read latency is leveraged in lieu of providing the replica controlled delay in order to provide the delay that may be required to match the DQS path with the DIN path, while at the same time avoid the duty distortion that would otherwise be caused by the replica controlled delay, which as noted earlier, can render the valid data window measurement inaccurate. More specifically, in example embodiments, use of the replica controlled delay is eschewed in favor of setting the read latency to a predetermined number of clock cycles. The write latency may be set to zero. By virtue of delaying the RE clock signal using the read latency setting, the DOUT is delayed, and because the DIN path is connected to the DOUT path in the test circuitry, the DIN path is automatically delayed. Then, a sweep of the DQS clock signal may be performed with a write latency of zero. In this manner, an accurate measurement of the valid data window can be obtained because the replica controlled delay is removed, and as such, the duty distortion that it otherwise would have caused is eliminated.

FIGS. 1 to 4G depict an example memory system that can be used to implement the technology disclosed herein. FIG. 1 is a functional block diagram of an example memory system 100. The components depicted in FIG. 1 are electrical circuits. Memory system 100 includes one or more memory dies 108, referred to hereinafter in the singular for ease of explanation. The memory die 108 can be a complete memory die or a partial memory die. In one embodiment, each memory die 108 includes a memory structure 126, control circuitry 110, and read/write circuits 128. Memory structure 126 is addressable by wordlines via a row decoder 124 and by bitlines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the memory die 108. However, in other systems, the controller can be separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters.

The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The (on-chip or off-chip) controller 122 (which in one embodiment is an electrical circuit) may comprise one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein. Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d—in communication with ROM 122a, RAM 122b, and processor(s) 122c—may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D)

memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 126 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
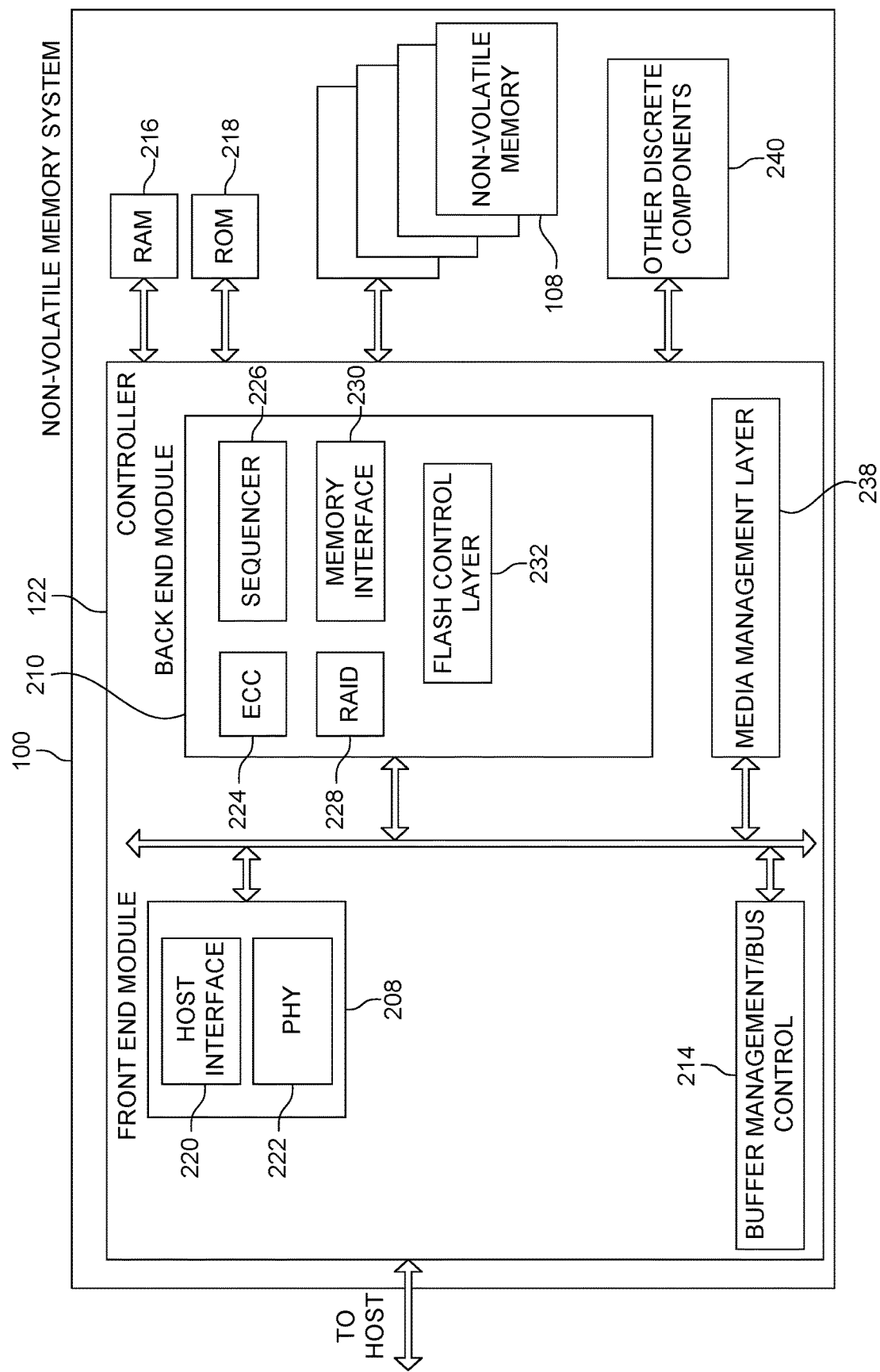
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that non-volatile memory 108 is not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other examples, memory system 100 can be a solid state drive (SSD).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Controller 122 may interface with one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

Figure 3:
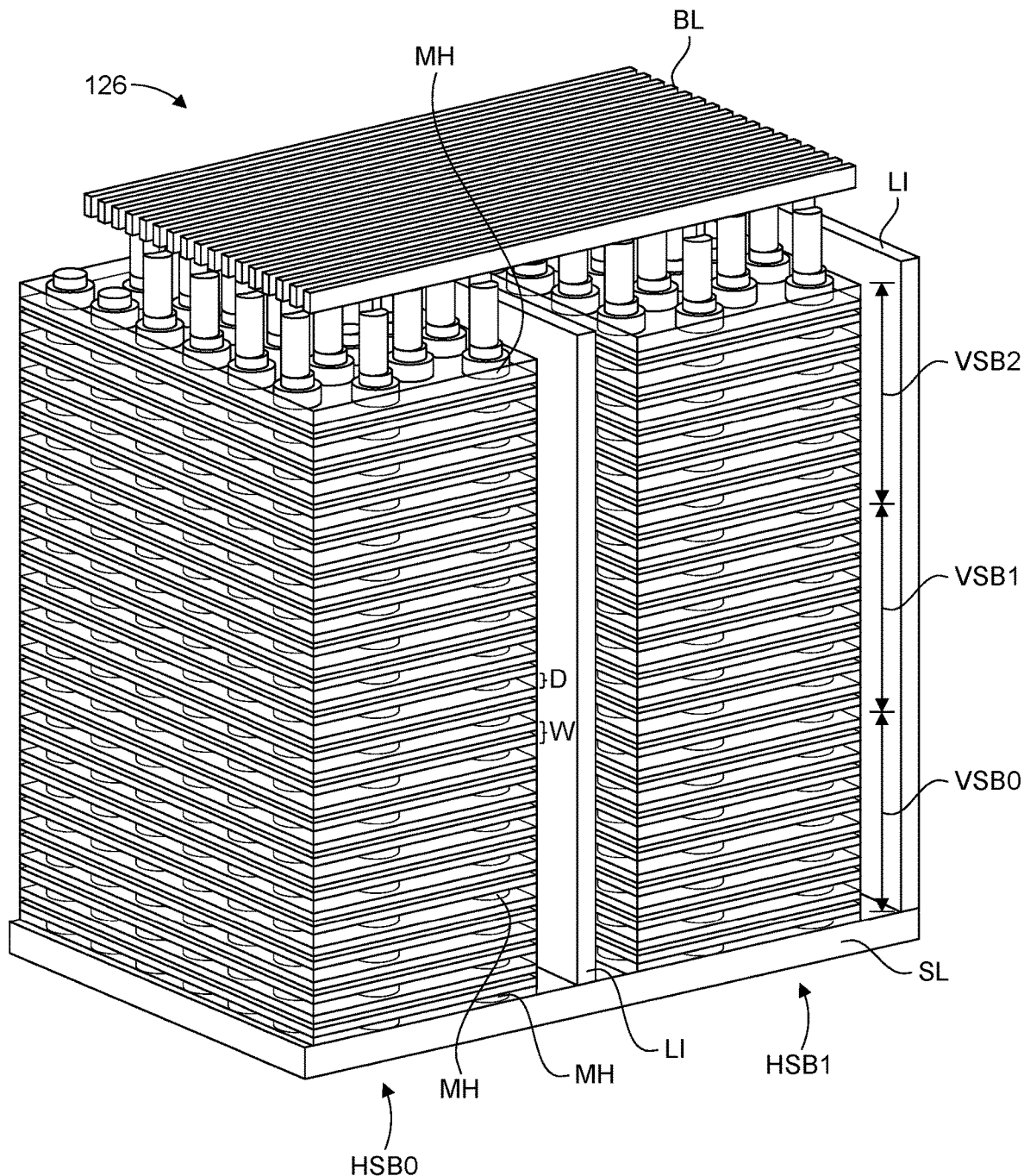
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 126 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
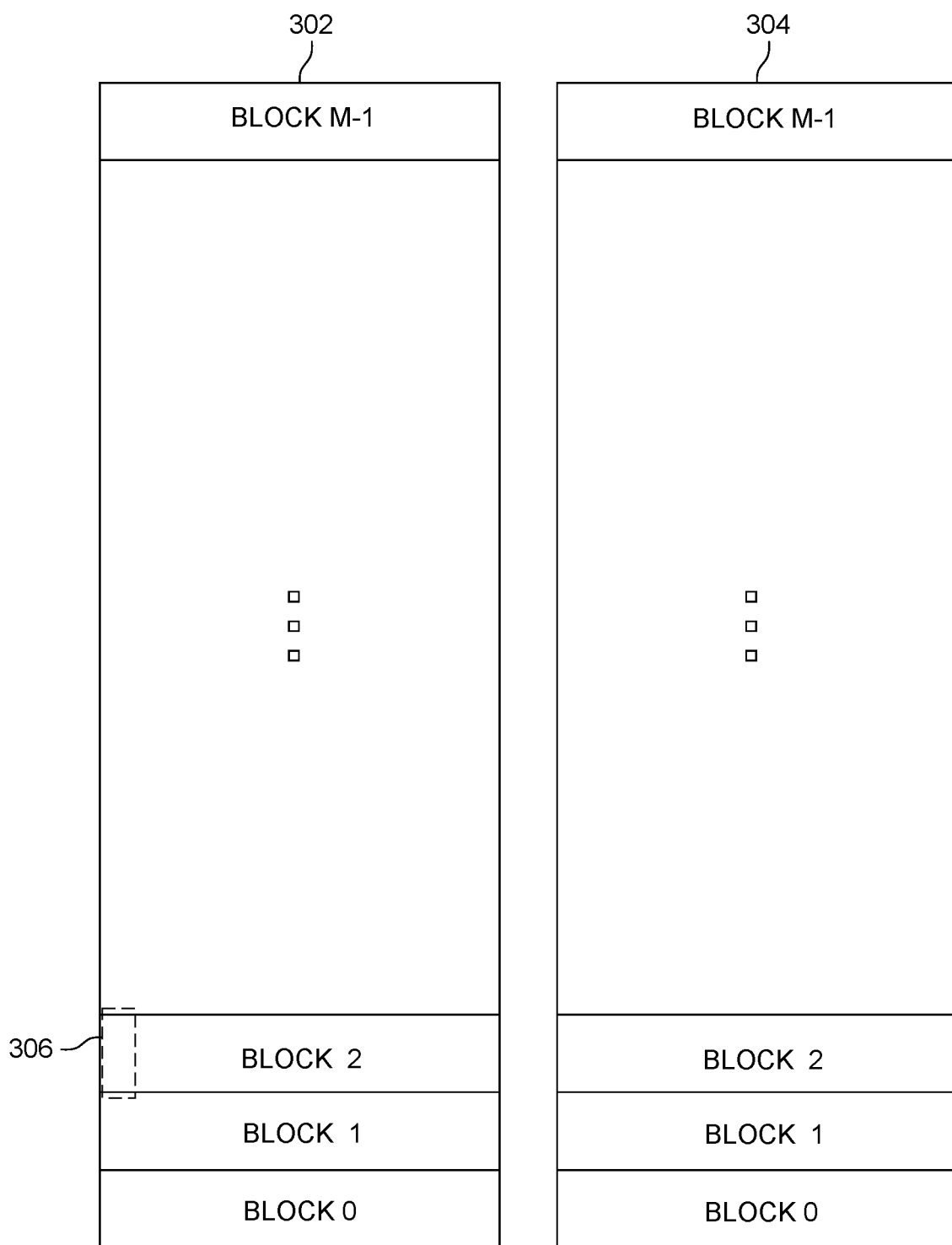
FIG. 4A is a block diagram of an example memory structure having two planes, in connection with which, example embodiments of the disclosed technology can be implemented.

FIG. 4A is a block diagram depicting one example organization of memory structure 126, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 126 to enable the signaling and selection circuits. In some embodiments, a block represents a groups of connected memory cells that share a common set of wordlines.

Figure 4B:
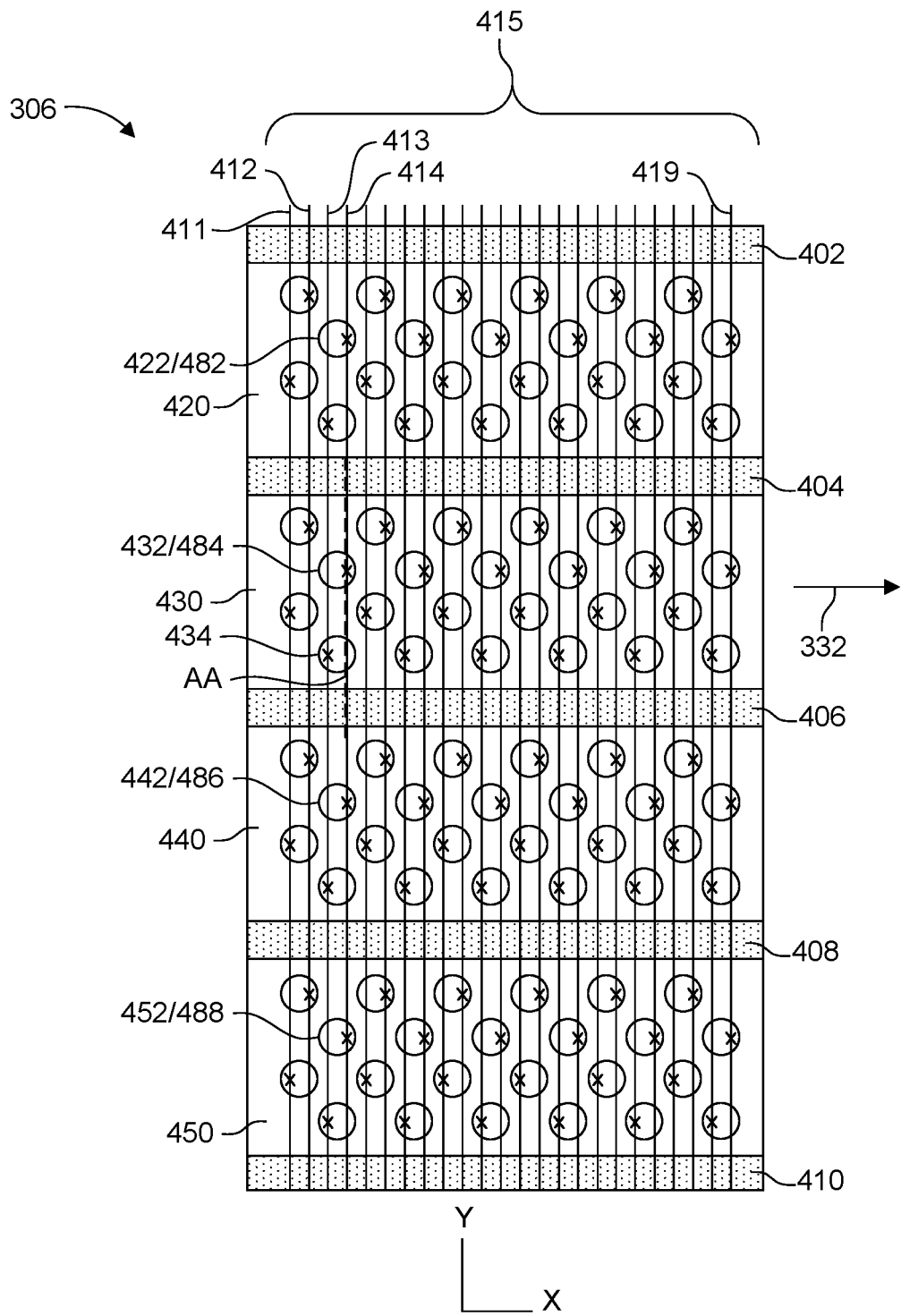
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 126 of FIG. 2. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
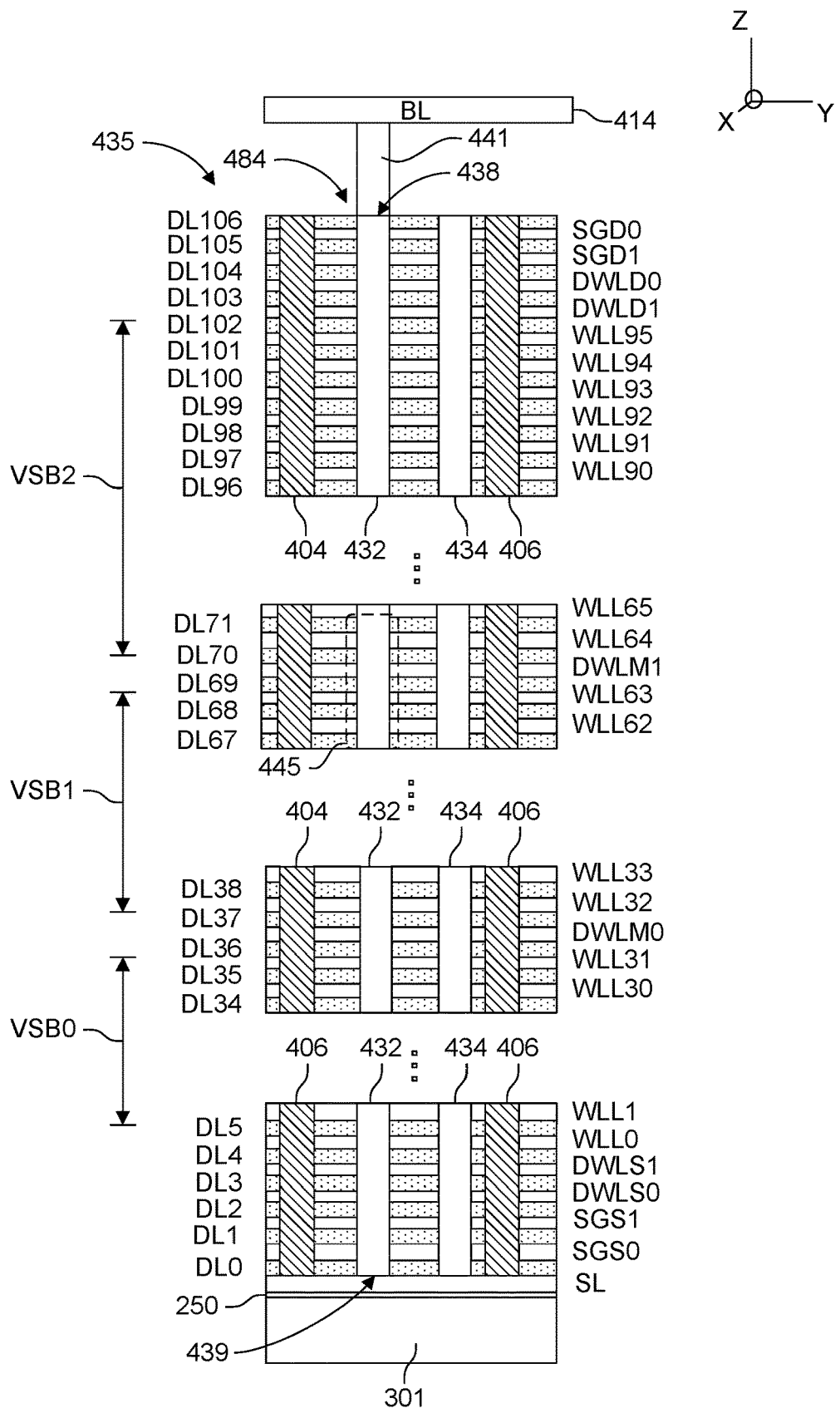
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
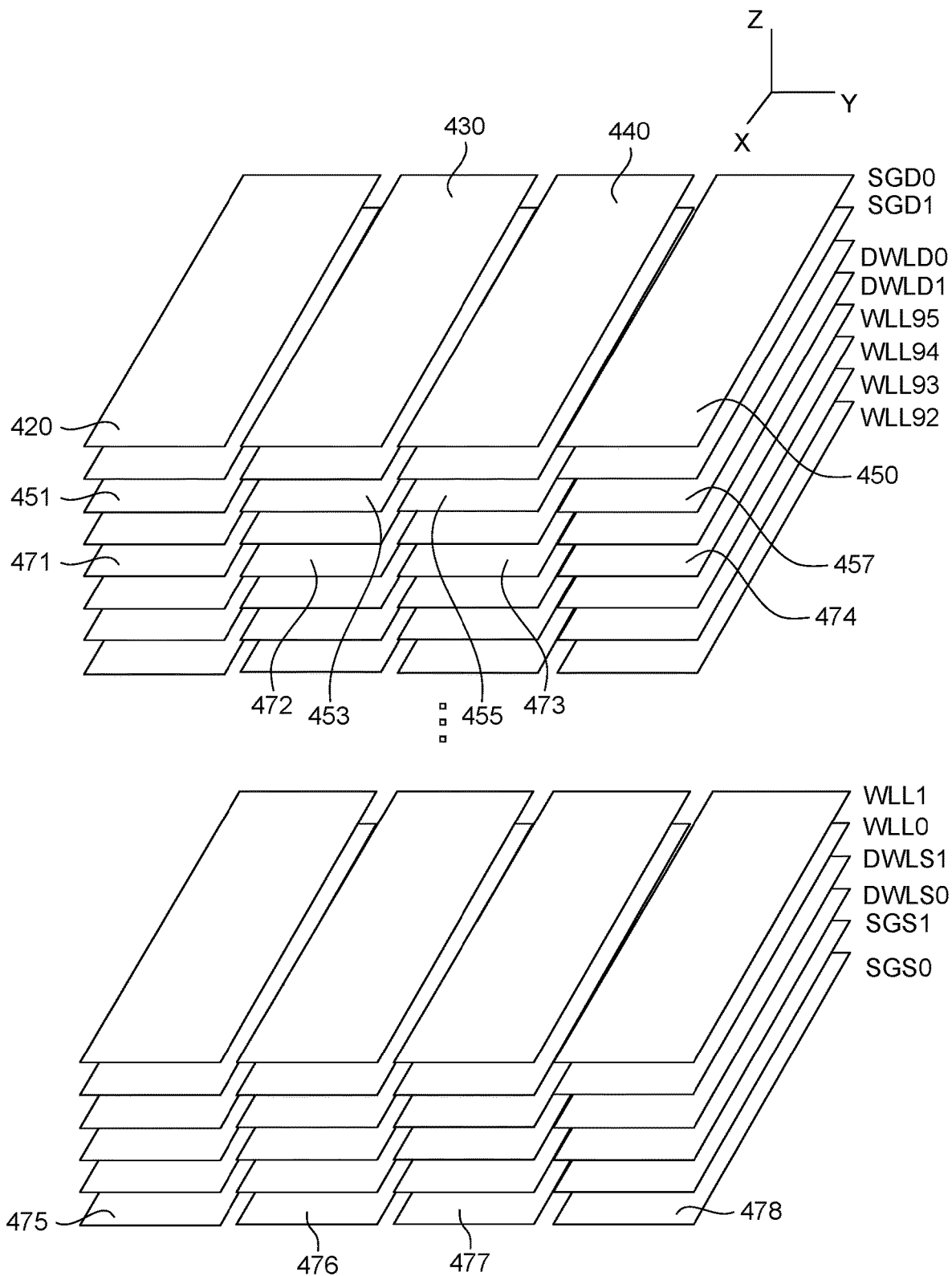
FIG. 4D depicts an alternative view of the select gate layers and wordline layers of the stack 435 of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
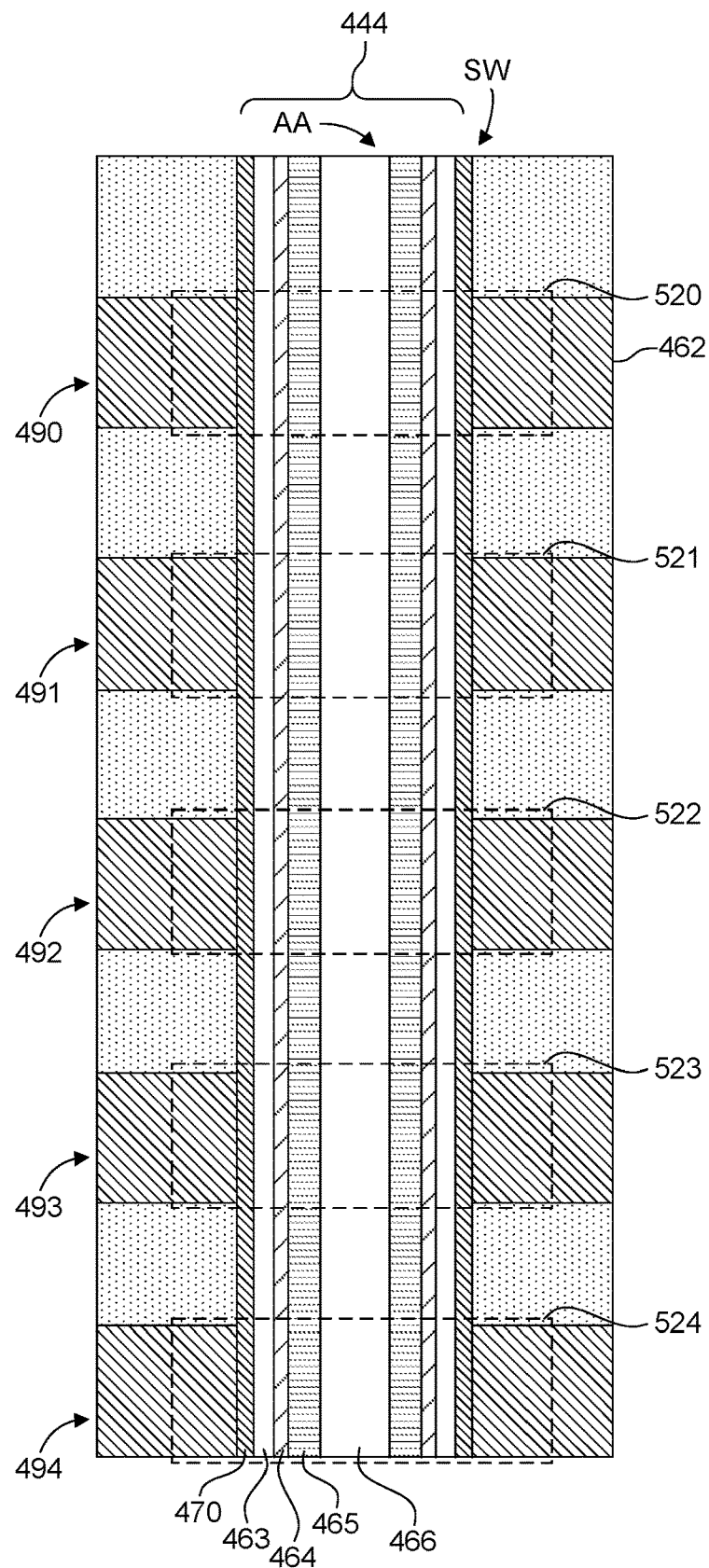
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
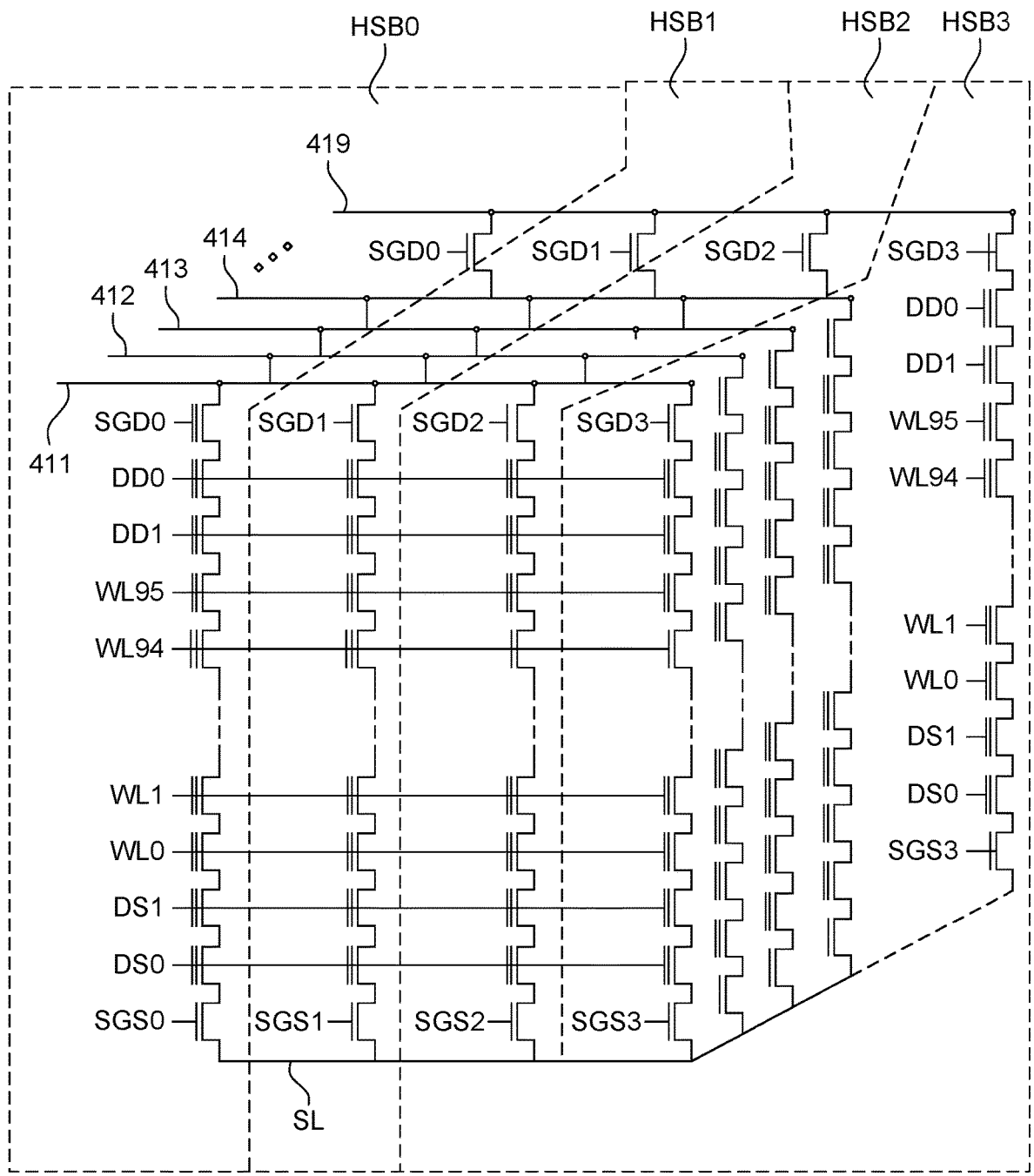
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
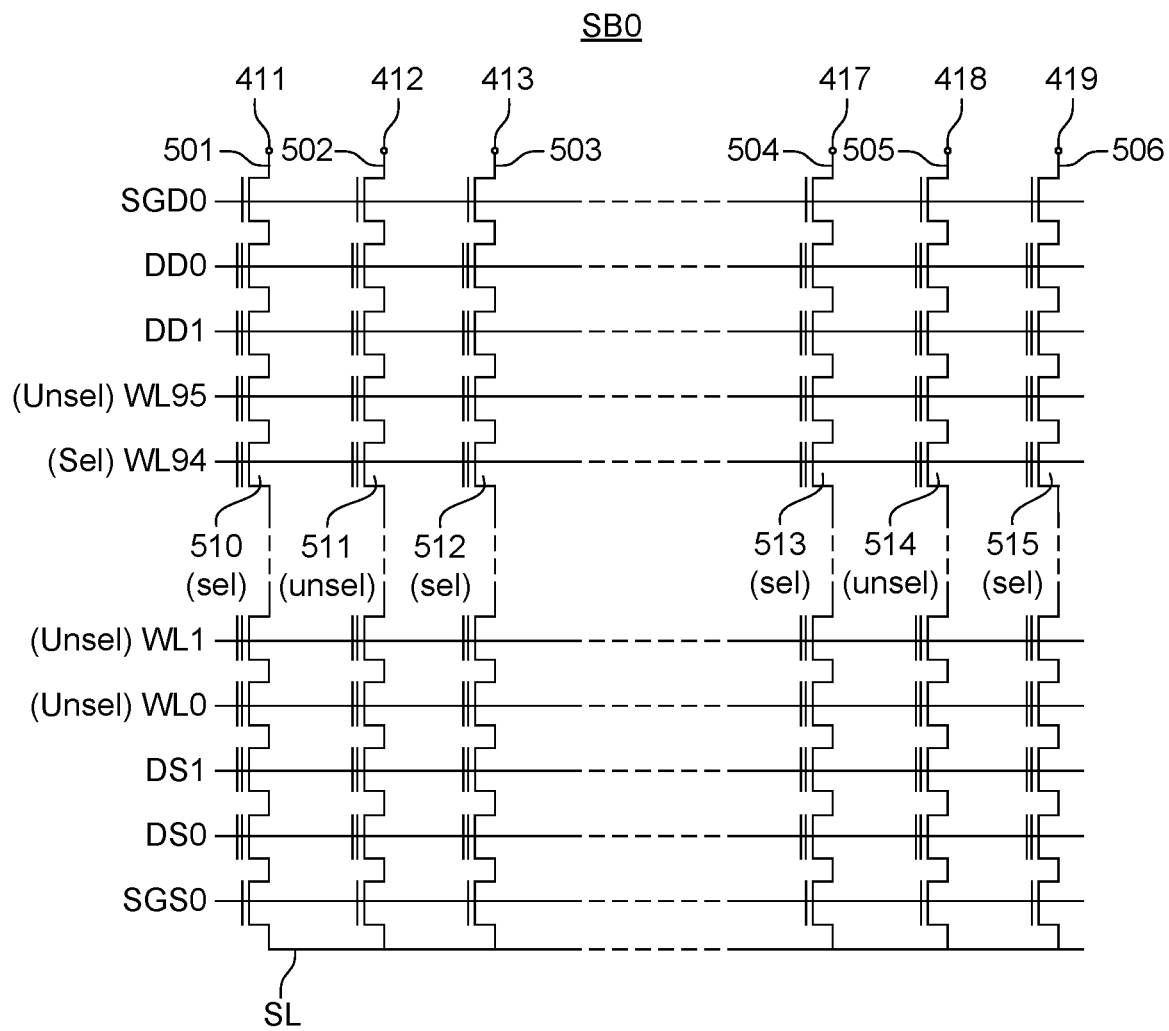
FIG. 4G is a schematic of a plurality of NAND strings showing one example horizontal sub-block, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

Figure 5:
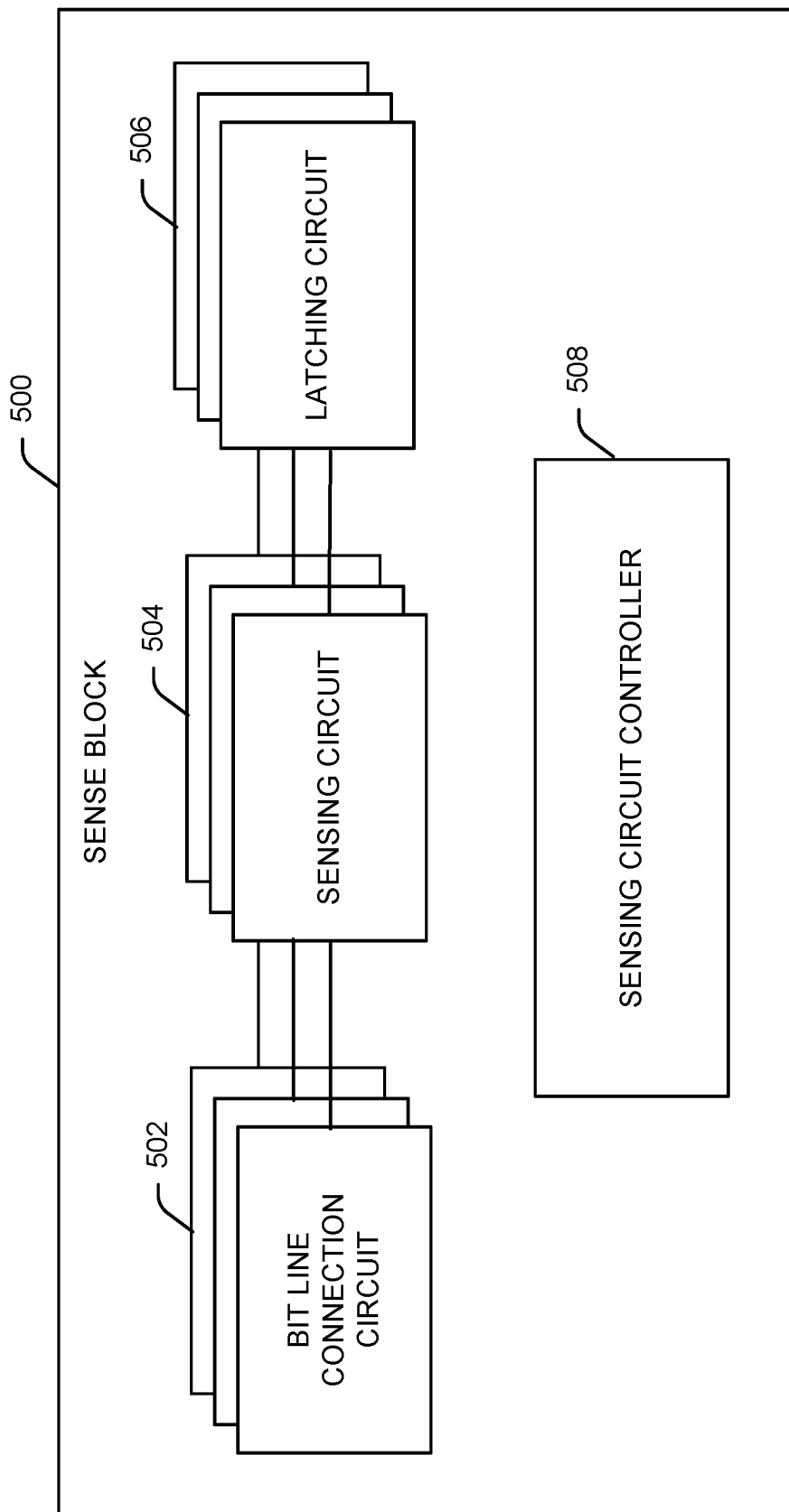
FIG. 5 is a schematic block diagram depicting an example configuration of a sense block of a memory die, in connection with which, example embodiments of the disclosed technology can be implemented.

FIG. 5 is a block diagram of an example configuration of a sense block 500, which may be representative of one of the sense blocks 150 (FIG. 1). The sense block 500 may include a plurality of sense circuits 504 and a plurality of sets of latching circuits 506. For example, there can be 16 k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other non-volatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality of bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is performed. For a verification operation, a target memory cell can be a memory cell being programmed in an associated program-verify operation.

When the bitline connection circuitry 502 connects the ith bitline BL(i) to the sensing circuit 504 (e.g. for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6A:
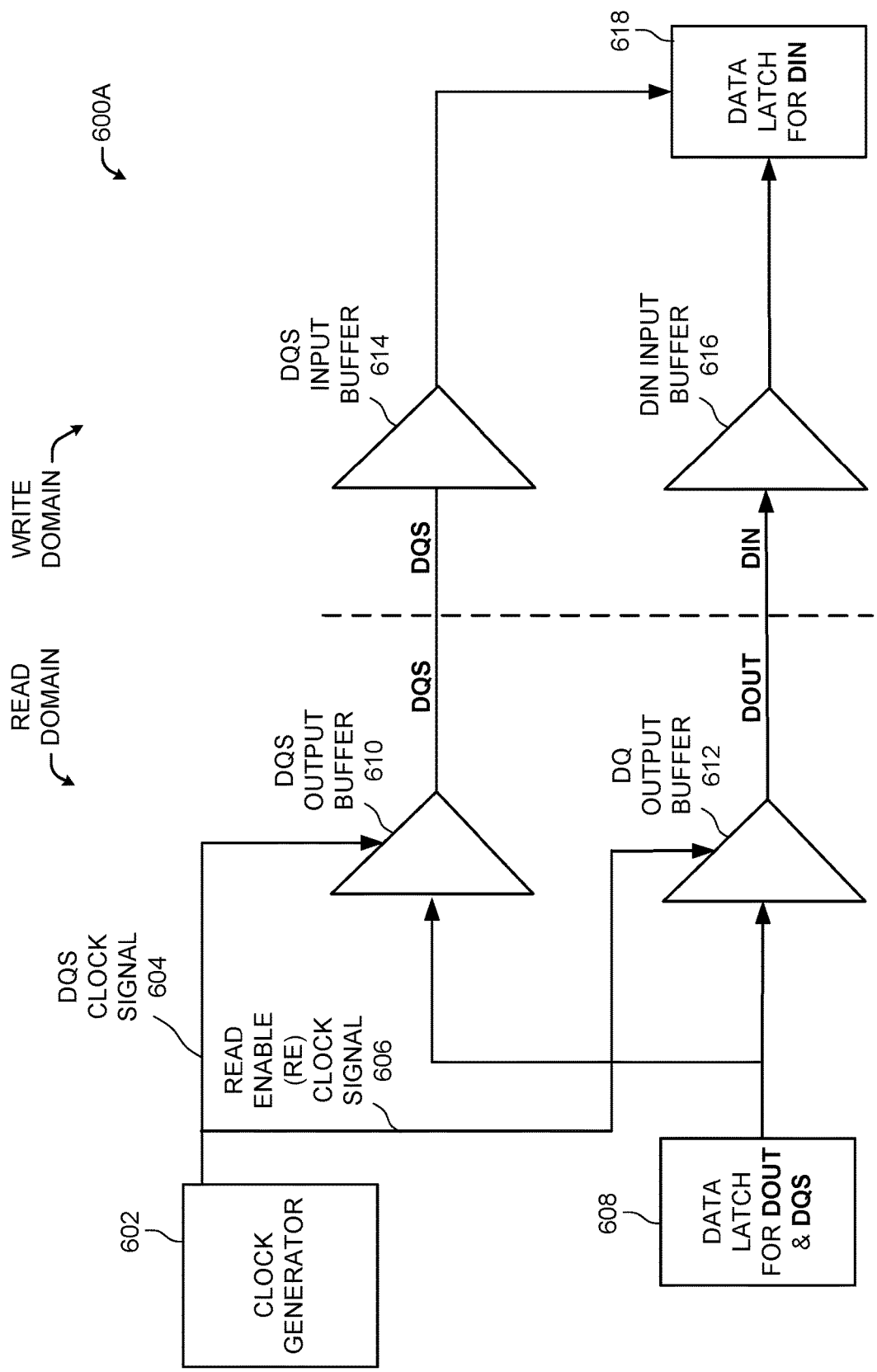
FIG. 6A is a schematic diagram of a built-in high-frequency test circuit.

FIG. 6A is a schematic diagram of a built-in high-frequency test circuit 600A. The built-in high-frequency test circuit 600A may operate by providing the same data that is read out from NAND flash memory to input buffers of the NAND, such that the looped data can serve as test data, thereby enabling high-speed testing at the wafer level. The looped path that allows data read out from the NAND to be provided as input data to the same NAND can be constructed by connecting output buffers of the NAND and to input buffers of the NAND. In particular, the test circuit 600A may connect a first output buffer of the NAND (e.g., a DQS output buffer 610) to a first input buffer of the NAND (e.g., a DQS input buffer 614). Alone the same lines, the test circuit 600A may connect a second output buffer of the NAND (e.g., a DQ output buffer that includes DOUT data) to a second input buffer of the NAND (e.g., a DIN input buffer 616).

The built-in high-frequency test circuit 600A may further include a clock generator 602 (which may be provided within the NAND itself). The clock generator 602 may be configured to generate a strobe clock signal (e.g., DQS clock signal 604) and a read enable (RE) clock signal 606, for example. The DQS clock signal 604 may be used to drive the DQS output buffer 610 and the RE clock signal may be used to drive the DQ output buffer 612. The DQS clock 604 and the RE clock 606 may be used to read data from internal latches 608 in the NAND and to place the read data in respective output buffers 610, 612. More specifically, data read using the DQS clock 604 may be placed in the DQS output buffer 610 and the DOUT data read using the RE clock 606 may be placed in the DQ output buffer 612. This capability to internally generate, within the NAND itself, the clock signals used to read data from the NAND—where the read data ultimately becomes input data to the NAND for testing purposes—obviates the need for an externally-provided clock.

The data read based on the DQS clock signal 604 may be transferred from the DQS output buffer 610 to the DQS input buffer 614, and ultimately to internal DIN latches 618 of the NAND. Similarly, the read DOUT data in the DQ output buffer 612 may be transferred to the DIN input buffer 616 of the NAND, and ultimately to the internal DIN latches 618. In this manner, data read out from the NAND itself can serve as input test data to the NAND, enabling high-speed NAND testing to be performed at the wafer level without the need for externally-provided clock signals or externally-provided test data.

Figure 6B:
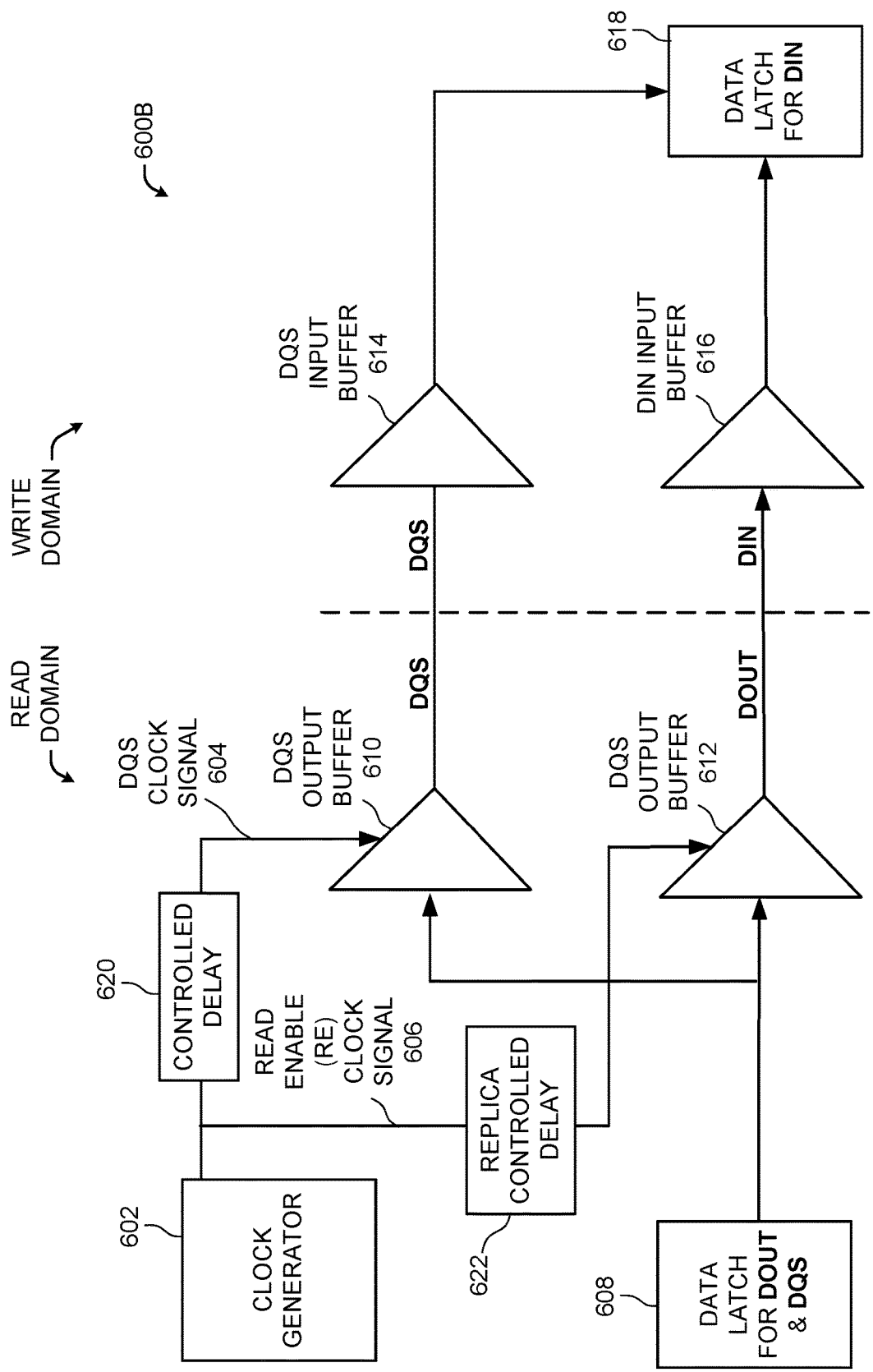
FIG. 6B is a schematic diagram of a built-in high-frequency test circuit with controlled delays introduced therein.

As previously noted, an objective of high-frequency testing at the wafer level may be to measure the valid data window to ensure that it meets NAND performance requirements. Measuring the valid data window may include performing a sweep of the DQS clock signal 604 to locate the valid data window. If, however, data coming in on the DIN input buffer 616 is not able to successfully latch due to insufficient set-up time, for example, the measurement of the valid data window may be inaccurate. To address the above-described concern, a controlled delay can be introduced to the DQS clock path in the read domain. FIG. 6B illustrates a built-in high-frequency test circuit 600B in which a controlled delay has been added to the DQS clock path.

Referring now to FIG. 6B, each component of circuit 600B that shares the same or a similar function as a corresponding component of circuit 600A is given the same reference numeral label in FIG. 6B as the corresponding component is given in circuit 600A. In the test circuit 600B of FIG. 6B, one or more circuit components 620 are added to the DQS clock path to introduce a controlled delay to the DQS clock signal 604. Introducing the controlled delay to the DQS clock path can shift the DQS clock signal 604 from being edge-aligned with the valid data window (as it is for DOUT operations) to being center-aligned with the valid data window (as it is for DIN operations). A sweep of the delayed DQS clock signal 604 can then be performed to locate the valid data window.

Introducing the controlled delay to the DQS clock path, however, can produce duty distortion which can result in an inaccurate measurement of the valid data window. Ideally, to help ensure accuracy of the valid data window measurement, the DQS clock signal 604 is generated to have a 50/50 duty ratio. Introducing the controlled delay as described above, however, can cause duty distortion, resulting in a deviation from the 50/50 duty ratio. This, in turn, can render the valid data window measurement inaccurate. Moreover, in order to match the DIN path with the delayed DQS path, one or more circuit components 622 may be provided in the clock path of the RE clock signal 606 to add a replica controlled delay to the RE clock signal 606 in the read domain. Similar to the duty distortion to the DQS clock signal 604 caused by the controlled delay, the replica controlled delay can cause duty distortion in the RE clock signal 606. Thus, if testing reveals a valid data window measurement that does not meet NAND flash performance requirements, it can be difficult to determine whether the valid data window truly does not meet the performance requirements or whether the measurement of the valid data window has been rendered inaccurate by duty distortion caused by one or both of the above-described clock signal delays.

Figure 7A:
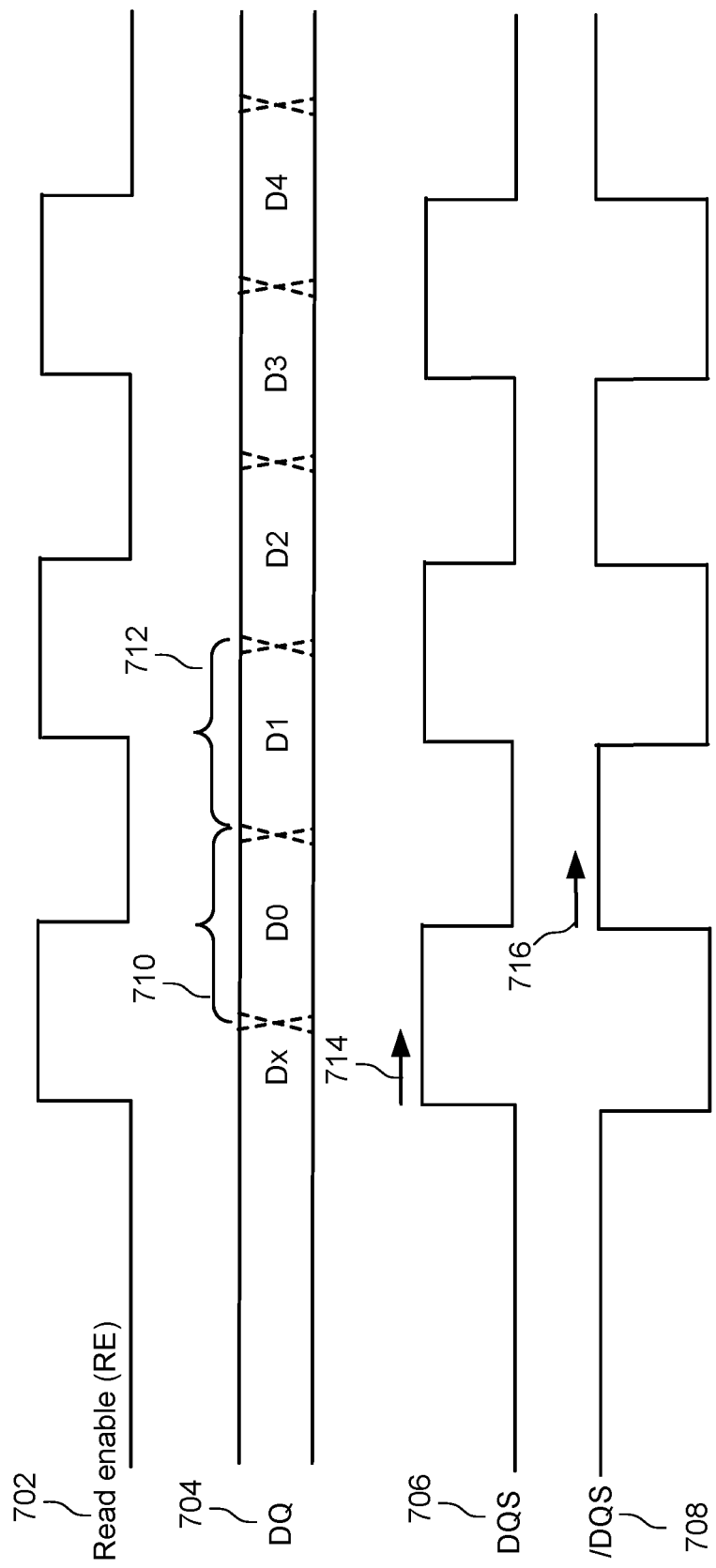
FIG. 7A schematically depicts a valid data window measurement technique according to example embodiments of the disclosed technology that mitigates the impact of duty distortion caused by the controlled delay introduced to the built-in high-frequency test circuit of FIG. 6B.

FIG. 7A schematically depicts a valid data window measurement technique according to example embodiments of the disclosed technology that mitigates or eliminates the impact of duty distortion caused by delays introduced to a built-in high-frequency test circuit for NAND flash, thereby ensuring accuracy of the valid data window measurement. In some embodiments, the technique schematically illustrated in FIG. 7A may be performed by a NAND flash controller (e.g., controller 122), by a specific built-in high-frequency test circuit controller, or the like.

FIG. 7A depicts a collection of clock signals including an RE clock signal 702, a strobe signal (e.g., DQS clock signal 706), and an inverted strobe signal (e.g., /DQS clock signal 708), which is signal obtained by inverting the strobe signal. In an example embodiment, to address the technical problem of duty distortion caused by a controlled delay introduced to a DQS clock path, instead of using both the rising and the falling edges of the DQS clock signal 706 to locate the valid data window, the rising edge of the DQS clock signal 706 may be used to locate the even data and the rising edge of the /DQS clock signal 708 may be used to locate the odd data. Conversely, in some embodiments, the rising edge of the DQS clock signal 706 may be used to locate the odd data and the rising edge of the /DQS clock signal 708 may be used to locate the even data In the embodiment depicted in FIG. 7A, a sweep 714 of the DQS clock signal 706 is performed to locate the even data in a DQ/DIN input buffer 704. More specifically, the sweep 714 may locate data elements D0, D2, D4, etc. In parallel with the sweep 714 of the DQS clock signal 706, a sweep 716 of the /DQS clock signal 708 may be performed to locate the odd data in the DQ/DIN input buffer 704. More specifically, the sweep 716 may locate data elements D1, D3, etc. A valid data window can then be determined as the window between a point at which the even data is located based on the rising edge sweep 714 of the DQS clock signal 706 and a point at which the odd data is located based on the rising edge sweep 716 of the /DQS clock signal 708. For instance, valid data window 710 can be determined from a point at which even data element D0 is located during the sweep 714 and a point at which odd data element D1 is located during sweep 716. Similarly, valid data window 712 can be determined from a point at which odd data element D1 is located during the sweep 716 and a point at which even data element D2 is located during sweep 714. Valid data window measurements of additional data windows can be made in a similar fashion. In some embodiments, while the rising edge of the DQS clock signal 706 is used to locate the even data during the sweep 714, the rising edge data of the /DQS clock signal 708 is ignored. Similarly, while the rising edge of the /DQS clock signal 708 is used to locate the odd data during the sweep 716, the rising edge data of the DQS clock signal 706 may be ignored.

Using the technique schematically depicted in FIG. 7A, the valid data window can still be captured/measured as the window between when the even data is located using the rising edge of the DQS clock signal 706 and when the odd data is located using the rising edge of the /DQS clock signal 708 (or potentially vice versa), but without running the risk of an inaccurate measurement of the valid data window that may otherwise result from duty distortion caused by a controlled delay on the DQS clock signal 706. More specifically, because duty distortion of the DQS clock signal 706 can alter its duty ratio, utilizing both the rising and the falling edges of the DQS clock signal 706 to locate the valid data window—as conventional techniques do—can lead to an inaccurate measurement of the valid data window. Embodiments of the disclosed technology utilize only the rising edges of the DQS clock signal 706 and the /DQS clock signal 708 to locate/measure the valid data window, and as such, can ensure accuracy of the measurement even in cases where delay on the DQS clock signal path causes serious duty distortion.

Figure 7B:
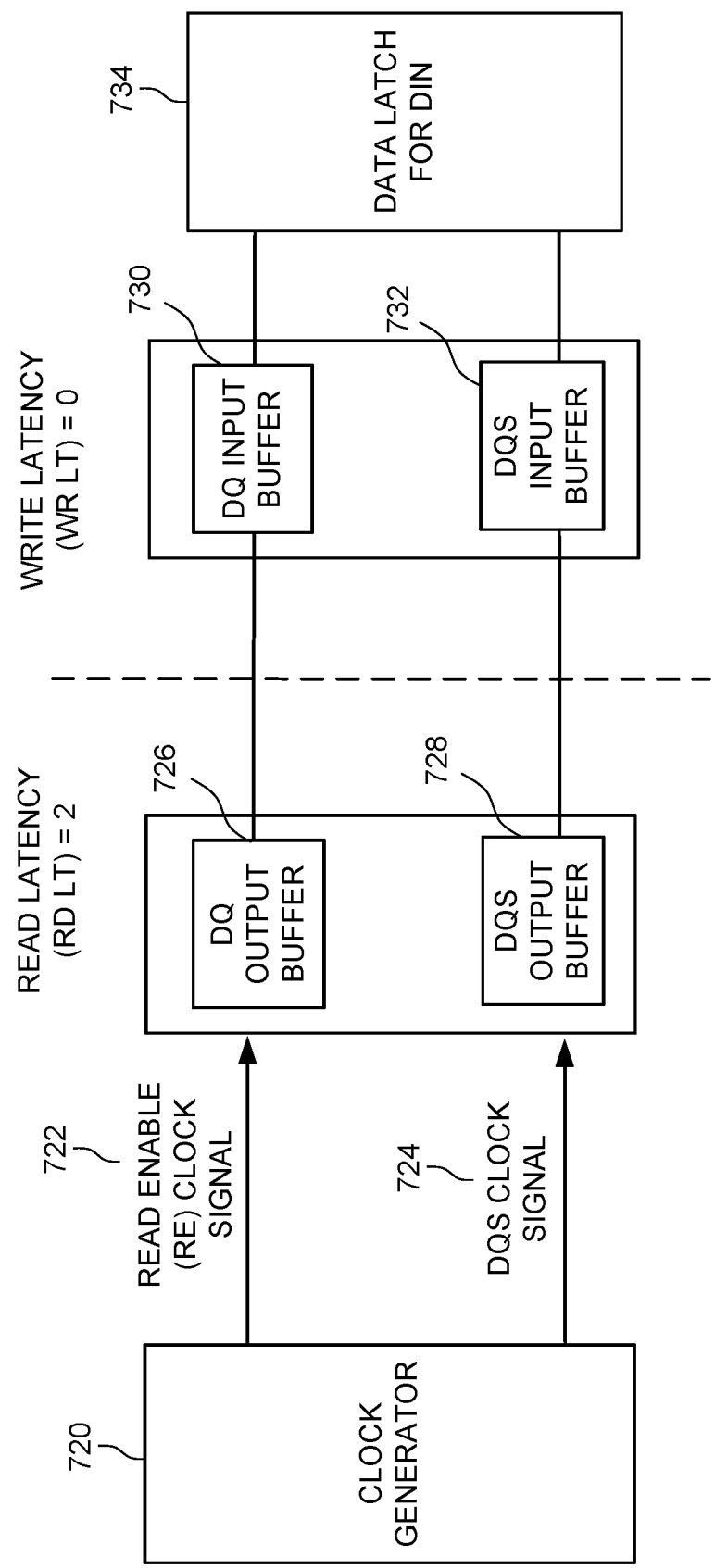
FIGS. 7B, 7C, and 7D schematically depict utilizing read and write latency control in lieu of a replica controlled delay in the built-in high-frequency circuit of FIG. 6B according to example embodiments of the disclosed technology in order to eliminate the duty distortion that would otherwise be caused by the replica controlled delay.
Figure 7C:
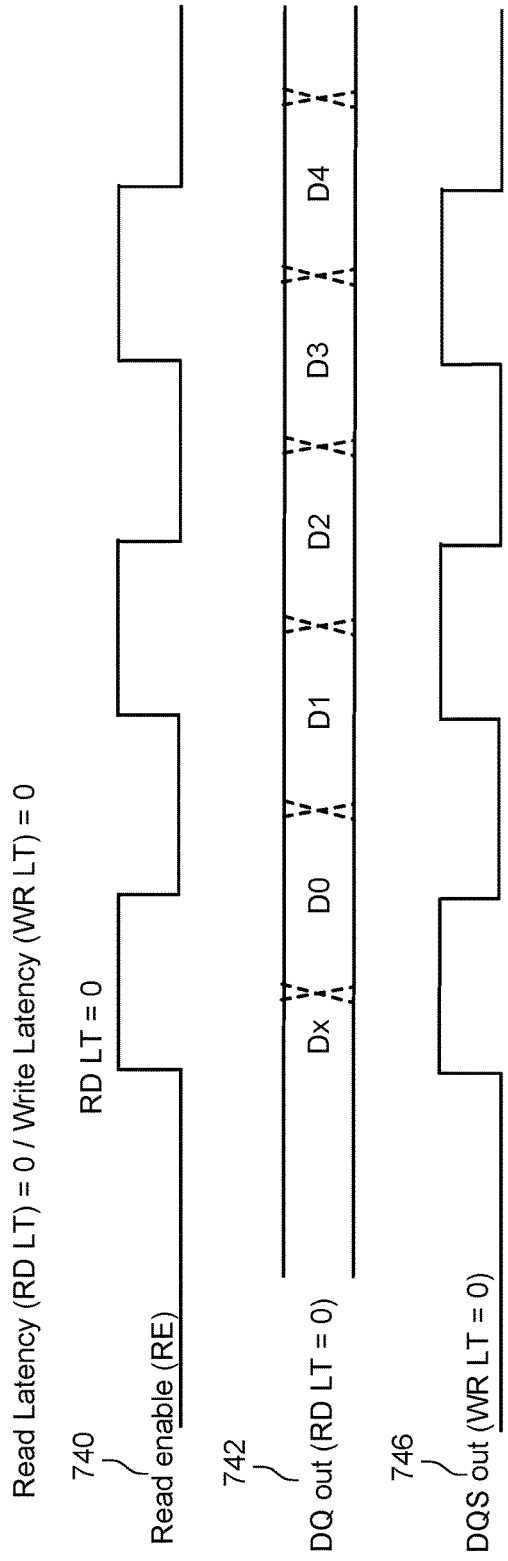
Figure 7D:
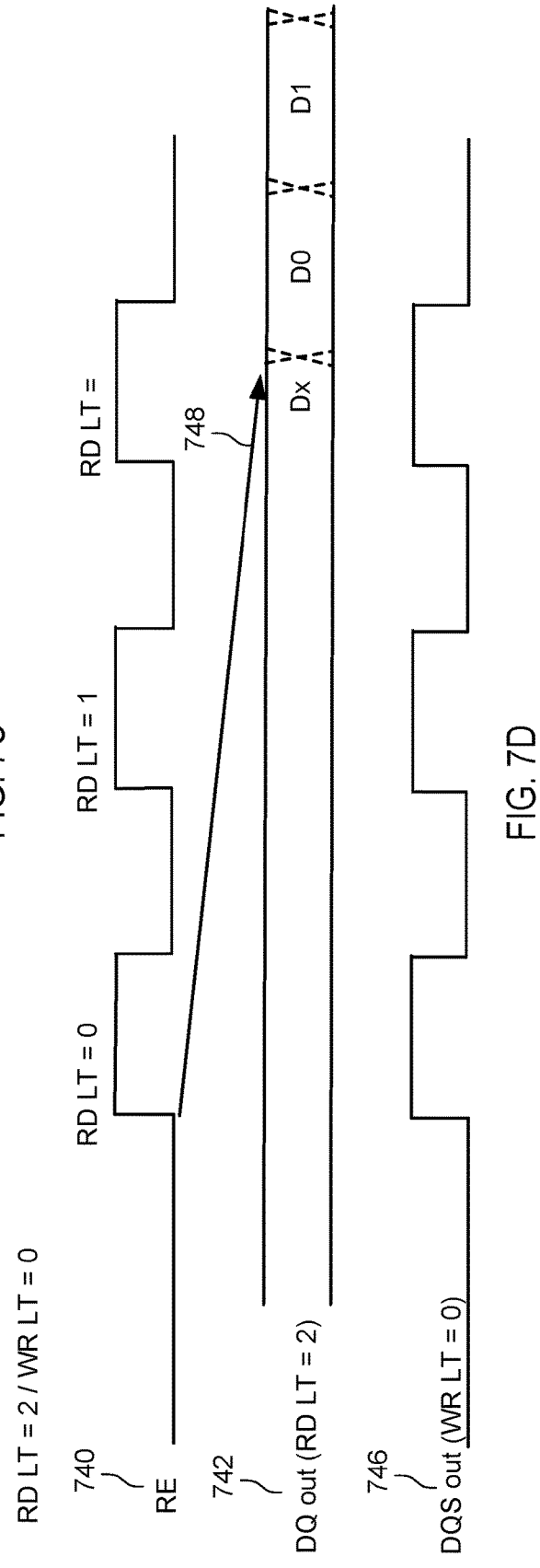

FIGS. 7B, 7C, and 7D schematically depict utilizing read and write latency control in lieu of a replica controlled delay in the built-in high-frequency circuit of FIG. 6B according to example embodiments of the disclosed technology in order to eliminate the duty distortion that would otherwise be caused by the replica controlled delay. In particular, in order to address the technical problem of duty distortion that is caused by the replica controlled delay in the RE clock signal path in the built-in high-frequency test circuit 600B of FIG. 6B, example embodiments of the disclosed technology leverage read and write latency in lieu of providing the replica controlled delay. In this manner, the requisite delay for matching the DQS path with the DIN path is still achieved, but at the same time, the duty distortion that would otherwise be caused by the replica controlled delay is avoided. Because, as noted earlier, the duty distortion to the RE clock signal caused by the replica controlled delay can render the valid data window measurement inaccurate, eliminating the replica controlled delay and instead using read and write latency to provide the needed delay, eliminates the duty distortions and ensures an accurate valid data window measurement. More specifically, in example embodiments, use of the replica controlled delay is eschewed in favor of setting the read latency to a first predetermined number of clock cycles. The write latency may be set to a second predetermined number of clock cycles that is less the first predetermined number of clock cycles. In some embodiments, the second predetermined number of clock cycles may be zero. By virtue of delaying the RE clock signal using the read latency setting, the DOUT is delayed, and because the DIN path is connected to the DOUT path in the built-in high-frequency test circuit, the DOUT path is automatically delayed. Then, a sweep of the DQS clock signal may be performed with a write latency of zero. In this manner, an accurate measurement of the valid data window can be obtained because the replica controlled delay is removed, and as such, the duty distortion that it otherwise would have caused is eliminated.

FIG. 7B schematically illustrates the clock paths and data flows in embodiments in which the read/write latency settings are used—in lieu of a replica controlled delay—to add delay to the RE clock signal. A clock generator 720 is shown. The clock generator 720 may generate an RE clock signal 722 and a strobe clock signal (e.g., a DQS clock signal 724). The RE clock signal 722 may drive the DQ output buffer 726, and the DQS clock signal 724 may drive the DQS output buffer 728. As previously described, the built-in high-frequency test circuitry may connect output buffers of the NAND to input buffers of the NAND. In particular, DQ output buffer 726 and DQS output buffer 728 may be respectively connected to DQ/DIN input buffer 730 and DQS input buffer 732. Internal DIN latches 734 for latching input data are also shown. As shown, the read latency is set to two clock cycles in this example, and the write latency is set to zero. By virtue of delaying the RE clock signal 722 using the read latency set to two clock cycles, the DOUT is delayed, and because the DIN path is connected to the DOUT path (i.e., the connection of DQ output buffer 726 to DQ/DIN input buffer 730; the connection of DQS output buffer 728 to DQS input buffer 732) in the built-in high-frequency test circuitry, the DIN path is automatically delayed.

FIG. 7C depicts an example use case in which the read latency is set to zero and the write latency is also set to zero. In this example, no delay is introduced to the RE clock signal 740. As such, there is no delay in the DOUT data being placed into the DQ output buffer 742. Moreover, the DQS clock signal 746 is aligned with the RE clock signal 740. FIG. 7D, on the other hand, depicts an alternative use case according to example embodiments of the disclosed technology. In the use case of FIG. 7D, the read latency is set to two clock cycles and the write latency is set to zero. As shown, by virtue of the delay introduced to the RE clock signal 740 by the read latency setting of two clock cycles, a corresponding delay 748 occurs in reading the DOUT data to the DQ output buffer 742. And, because the DIN path is connected to the DOUT path in the built-in high-frequency test circuitry, the DIN path is automatically delayed.

Figure 8:
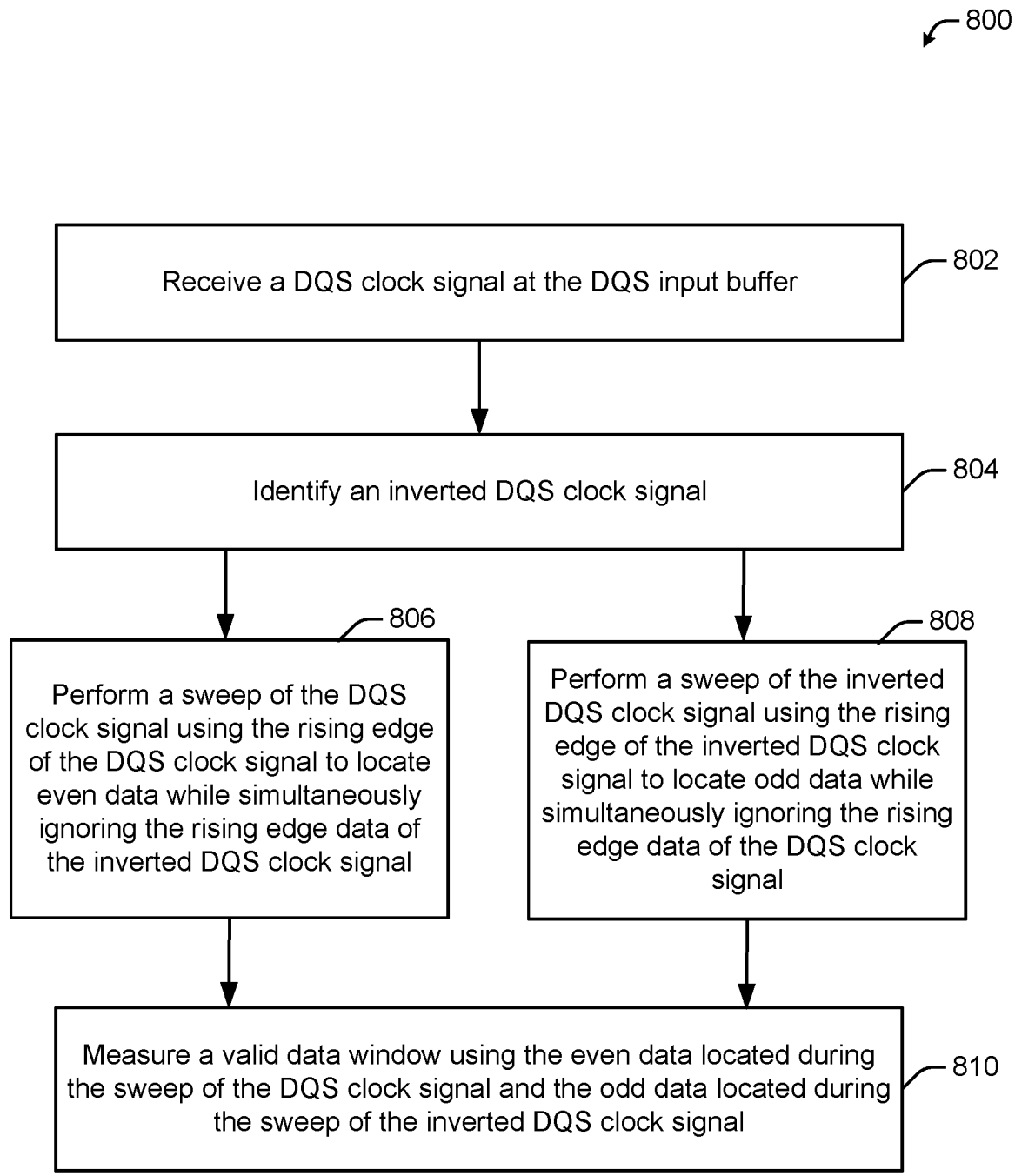
FIG. 8 is a flowchart of an illustrative method for implementing the valid data window measurement technique schematically depicted in FIG. 7A according to example embodiments of the disclosed technology.

FIG. 8 is a flowchart of an illustrative method 800 for implementing the valid data window measurement technique schematically depicted in FIG. 7A according to example embodiments of the disclosed technology. The method 800 may be performed by a NAND flash controller (e.g., controller 122), by a specific built-in high-frequency test circuit controller, or the like.

At block 802 of the method 800, a DQS clock signal may be received at a DQS input buffer. The a clock generator may have generated the DQS clock signal, which may then be used to drive a DQS output buffer that is connected to a DQS input buffer as part of a built-in high-frequency test circuit implementation. At block 804 of the method 800, an inverted DQS clock signal may be identified. The inverted DQS clock signal may be a signal obtained by inverting the DQS clock signal. In some embodiments, the clock generator may generate the inverted DQS clock signal as well, and it may be received at the DQS input buffer. In other example embodiments, a clock generator at a DIN side may generate the inverted DQS clock signal from the DQS clock signal.

In some embodiments, the operations at blocks 806 and 808 may be performed at least partially concurrently, and in some case, simultaneously. At block 806 of the method 800, a first sweep of the DQS clock signal may be performed in which the rising edge of the DQS clock signal may be used to locate even data. At block 808 of the method 800, a second sweep of the inverted DQS clock signal may be performed in which the rising edge of the inverted DQS clock signal may be used to locate odd data. In some embodiments, during the first sweep of the DQS clock signal performed at block 806, the rising edge data (or the rising edge and/or the falling edge data, more generally) of the inverted DQS clock signal may be ignored. Similarly, during the second sweep of the inverted DQS clock signal performed at block 808, the rising edge data (or the rising edge and/or the falling edge data, more generally) of the DQS clock signal may be ignored. Then, at block 810 of the method 800, a valid data window may be measured using data detected during the first and second sweeps. More specifically, a valid data window may be measured using the even data located during the first sweep of the DQS clock signal and the odd data located during the second sweep of the inverted DQS clock signal.

It should be appreciated that variations of the method 800 are also within the scope of the disclosed technology. For example, in alternative embodiments, the sweep of the DQS clock signal may involve using the rising edge of the DQS clock signal to locate the odd data and the sweep of the inverted DQS clock signal may involve using the rising edge of the inverted DQS clock signal to locate the even data. Further, in certain embodiments, the falling edge of the DQS clock signal may be used to locate one of the even or odd data and/or the falling edge of the inverted DQS clock signal may be used to locate the other one of the even or odd data. In particular, any variation that does not involving using both the rising and the falling edge of the same signal (e.g., the DQS clock signal or the inverted DQS clock signal) may fall within the scope of the disclosed technology.

Figure 9:
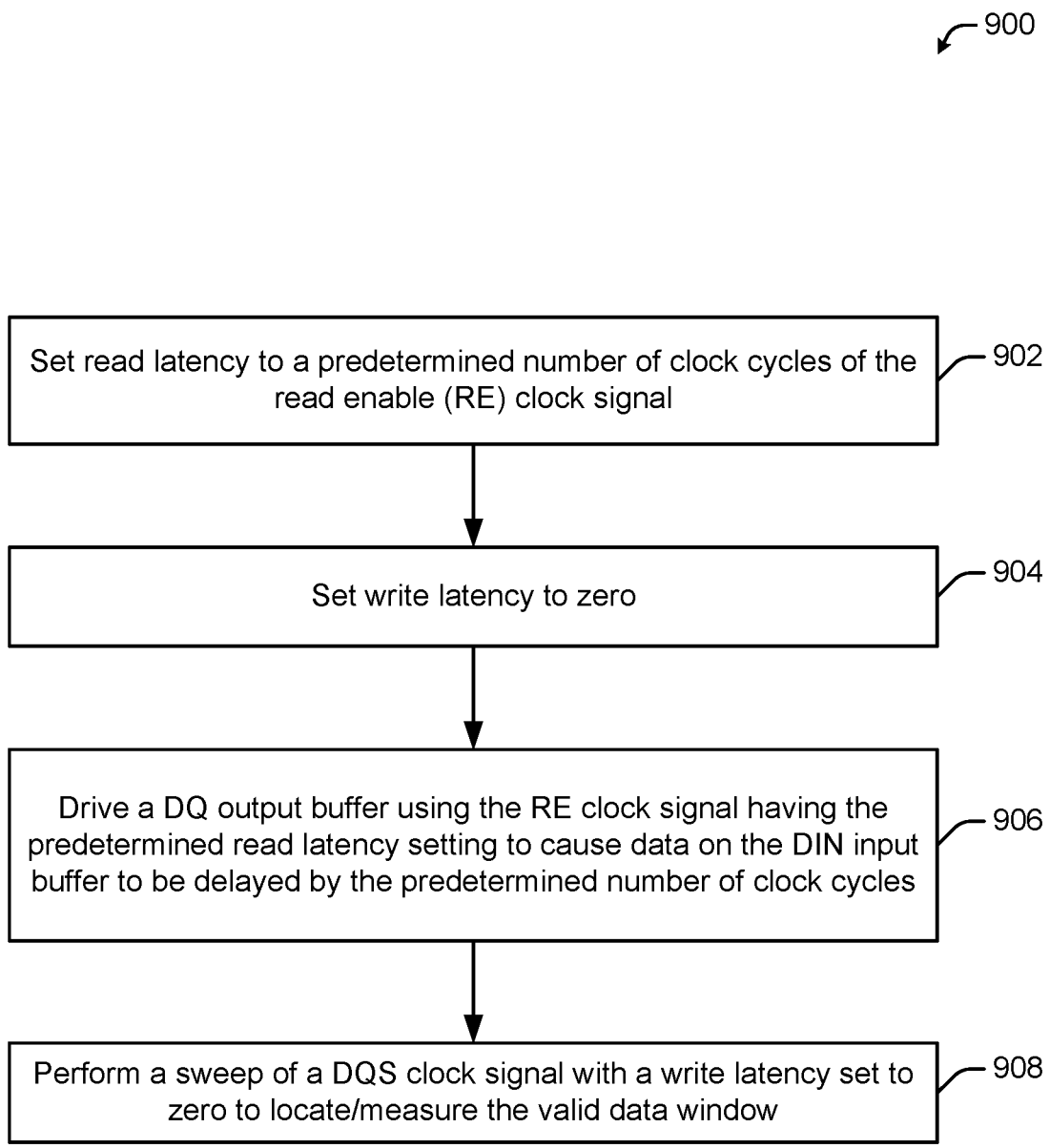
FIG. 9 is a flowchart of an illustrative method for implementing the latency control schematically depicted in FIGS. 7B, 7C, and 7D.

FIG. 9 is a flowchart of an illustrative method 900 for implementing the latency control schematically depicted in FIGS. 7B, 7C, and 7D. The method 900 may be performed by a NAND flash controller (e.g., controller 122), by a specific built-in high-frequency test circuit controller, or the like. As previously noted, the method 900 may be performed in lieu of providing a replica controlled delay to the RE clock signal.

At block 902 of the method 900, the read latency may be set to a first predetermined number of clock cycles. In some embodiments, the first predetermined number of clock cycles may be any integer greater than zero. At block 904 of the method 900, the write latency may be set to a second predetermined number of clock cycles that is less than the first predetermined number of clock cycles. In some embodiments, the second predetermined number of clock cycles may be zero. At block 906 of the method 900, a DQ output buffer may be driven using the RE clock signal with the predetermined read latency setting to cause data on the DIN input buffer to be delayed by the first predetermined number of clock cycles. Then, at block 908 of the method 900, a sweep of the DQS clock signal may be performed with a write latency set to the second predetermined number of clock cycles (e.g., zero) to locate/measure the valid data window.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In an embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in an embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

What is claimed is:

1. A method of performing wafer-level testing of NAND flash memory, the method comprising:
    receiving a strobe clock signal at an input buffer of the NAND flash memory;
    performing a first sweep of the strobe clock signal, wherein performing the first sweep comprises using a rising edge of the strobe clock signal to locate one of even or odd data in the input buffer;
    performing a second sweep of an inverted strobe clock signal obtained by inverting the strobe clock signal, wherein performing the second sweep comprises using a rising edge of the inverted strobe clock signal to locate the other of the even or odd data in the input buffer; and
    measuring a valid data window of data in the input buffer based on the first sweep and the second sweep.

2. The method of claim 1, wherein performing the first sweep comprises ignoring rising edge data of the inverted strobe clock signal during the first sweep.

3. The method of claim 1, wherein performing the second sweep comprises ignoring rising edge data of the strobe clock signal during the second sweep.

4. The method of claim 1, wherein measuring the valid data window of data in the input buffer based on the first sweep and the second sweep comprises measuring a window between at point at which the even data is located using the rising edge of the strobe clock signal during the first sweep and a point at which the odd data is located using the rising edge of the inverted strobe clock signal during the second sweep.

5. The method of claim 1, wherein a clock path of the strobe clock signal comprises a controlled delay that causes duty distortion in the strobe clock signal, and wherein the duty distortion does not impact an accuracy of the valid data window measurement.

6. The method of claim 1, wherein the strobe clock signal is a DQS clock signal and the input buffer is a DQS input buffer.

7. A built-in high-frequency test circuit for NAND flash memory comprising first and second input buffers and first and second output buffers, the circuit comprising:
    a clock generator configured to generate a strobe clock signal and a read enable (RE) clock signal;
    a first clock path for the strobe clock signal, the first clock path connecting the first output buffer to the first input buffer;
    a second clock path for the RE clock signal, the second clock path connecting the second output buffer to the second input buffer; and
    a test circuit controller configured to:
        receive the strobe clock signal at the first input buffer;
        perform a first sweep of the strobe clock signal, wherein performing the first sweep comprises using one of a rising edge or a falling edge of the strobe clock signal to locate one of even or odd data in the first input buffer;
        perform a second sweep of an inverted strobe clock signal obtained by inverting the strobe clock signal, wherein performing the second sweep comprises using one of a rising edge or a falling edge of the inverted strobe clock signal to locate the other of the even or odd data in the first input buffer; and
        measure a valid data window of data in the first input buffer based on the first sweep and the second sweep.

8. The built-in high-frequency test circuit of claim 7, wherein the test circuit controller is further configured to ignore edge data of the inverted strobe clock signal during the first sweep.

9. The built-in high-frequency test circuit of claim 7, wherein the test circuit controller is configured to ignore edge data of the strobe clock signal during the second sweep.

10. The built-in high-frequency test circuit of claim 7, wherein the test circuit controller is configured to measure the valid data window of data in the first input buffer based on the first sweep and the second sweep by measuring a window between at point at which the even data is located using the one of the rising edge or the falling edge of the strobe clock signal during the first sweep and a point at which the odd data is located using the one of the rising edge or the falling edge of the inverted strobe clock signal during the second sweep.

11. The built-in high-frequency test circuit of claim 7, wherein the first clock path comprises a controlled delay that causes duty distortion in the strobe clock signal, and wherein the duty distortion does not impact an accuracy of the valid data window measurement.

12. The built-in high-frequency test circuit of claim 7, wherein the strobe clock signal is a DQS clock signal, the first output buffer is a DQS output buffer, the first input buffer is a DQS input buffer, the second output buffer is a DQ output buffer, and the second input buffer is a DIN input buffer.

* * * * *